| (12) | United States Patent | (10) Patent No.: | US 7,081,890 B2 |
|---|---|---|---|
| | Park et al. | (45) Date of Patent: | Jul. 25, 2006 |

(54) BI-DIRECTIONAL DRIVING CIRCUIT OF FLAT PANEL DISPLAY DEVICE AND METHOD FOR DRIVING THE SAME

(75) Inventors: Jae Deok Park, Kyongsangbuk-do (KR); Du Hwan Oh, Chungcheongbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 325 days.

(21) Appl. No.: 10/422,810

(22) Filed: Apr. 25, 2003

(65) Prior Publication Data

US 2004/0125069 A1 Jul. 1, 2004

(30) Foreign Application Priority Data

Dec. 31, 2002 (KR) .................... 10-2002-0087967

(51) Int. Cl.
*G09G 3/36* (2006.01)
(52) U.S. Cl. .................... 345/204; 345/100; 377/64
(58) Field of Classification Search ................ 345/204, 345/690, 100; 277/64, 69
See application file for complete search history.

(56) References Cited

U.S. PATENT DOCUMENTS 6,483,889 B1 * 11/2002 Kim et al. .................... 377/54

* cited by examiner

*Primary Examiner*—Alexander Eisen
*Assistant Examiner*—Duc Dinh
(74) *Attorney, Agent, or Firm*—McKenna Long & Aldridge LLP (57) ABSTRACT

A bi-directional driving circuit of a flat panel display device and method for driving the same is disclosed in the present invention. The bi-directional driving circuit of a flat panel display device having a plurality of blocks driven by a start pulse Vst, first to fourth clock signals having different phases CLK1, CLK2, CLK3, and CLK4, and first and second power source voltages Vdd and Vss, each block includes a shift register comprising a first control part charging the start pulse Vst or an output signal of a previous block to a first node Q according to either one of the first to fourth clock signals or a second node QB, a second control part controlling the second node QB according to the start pulse Vst, either the output signal of the previous block or an output signal of the next block, and one of the first to fourth clock signals, a third control part charging the start pulse Vst or the output signal of the next block to the first node Q according to either one of the first to fourth clock signals, or controlling the second node QB, and a buffer outputting one of the first to fourth clock signals as a shift pulse according to the first and second nodes Q and QB; and a level shifter shifting a level of the shift pulse output from the shift register in each block, and outputting the shifted level.

17 Claims, 8 Drawing Sheets

Input signals

Output signals of shift registers & level shifters

FIG.6

Input signals

Output signal of the shift register

Output signal of the level shifter

FIG. 7

Input signals

Output signal of the shift register

Output signal of the level shifter

BI-DIRECTIONAL DRIVING CIRCUIT OF FLAT PANEL DISPLAY DEVICE AND METHOD FOR DRIVING THE SAME

This application claims the benefit of the Korean Patent Application No. P2002-087967 filed on Dec. 31, 2002, which is hereby incorporated by reference.

BACKGROUND OF THE INVENTION

1. Field of the Invention

The present invention relates to a flat panel display device, and more particularly, to a bi-directional driving circuit of a flat panel display device and method for driving the same. Although the present invention is suitable for a wide scope of applications, it is particularly suitable for enabling a bi-directional driving without an additional input pad and an input signal.

2. Discussion of the Related Art

A typical liquid crystal display (LCD) device includes a driving circuit in an LCD panel, such as a gate driving integrated circuit (IC) and a data driving IC. Also, the LCD device has a fixed driving direction, so that system manufacturers sometimes require various panels according to a related art.

Figure 1:
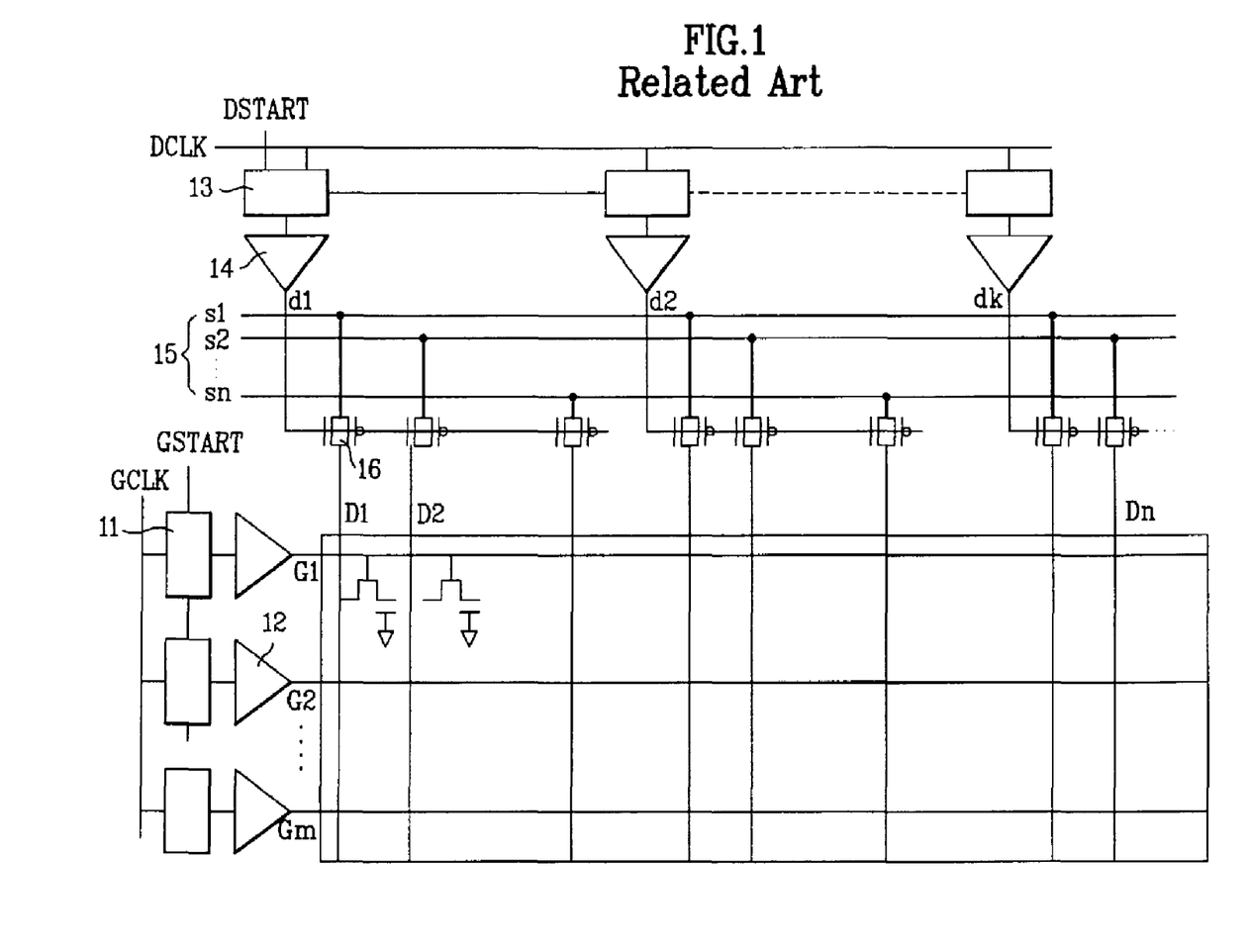
FIG. 1 is a circuit diagram of a related art liquid crystal display (LCD) panel.

FIG. 1 is a circuit diagram of a related art liquid crystal display (LCD) panel.

Referring to FIG. 1, a polysilicon thin film transistor (TFT) LCD panel includes a pixel array having a plurality of gate lines G1 to Gm arranged to cross a plurality of data lines D1 to Dn, a plurality of first shift registers 11 and first buffers 12 supplying scan signals to each gate line, a plurality of second shift registers 13 and second buffers 14 driving the data lines respectively located in each block of the 'k' blocks divided from each data line, a plurality of signal lines S1 to Sn transmitting video signals output from a digital-to-analog converter 5 of a data driving circuit 2 to each data line, and a plurality of switching elements 16 sequentially applying the video signals of the signal lines S1 to Sn to the data lines per each block by using the driving signals output from the second shift registers 13 and second buffers 14.

Unlike the conventional amorphous silicon circuit, in the driving circuit of the polysilicon TFT LCD panel, the data lines are divided into 'm' blocks while the gate lines are selected, thereby reducing the number of contact lines between an external circuit and a panel, so that a display voltage is sequentially supplied to the data lines. Therefore, the gate lines and the data lines are sequentially driven by the shift registers to display picture images. In this case, since the shift registers implement shifting only in a fixed direction, a degree of freedom in a driving direction required by system manufacturers is very limited.

A shift register of the related art LCD panel will be described with reference to FIG. 2.

Figure 2:
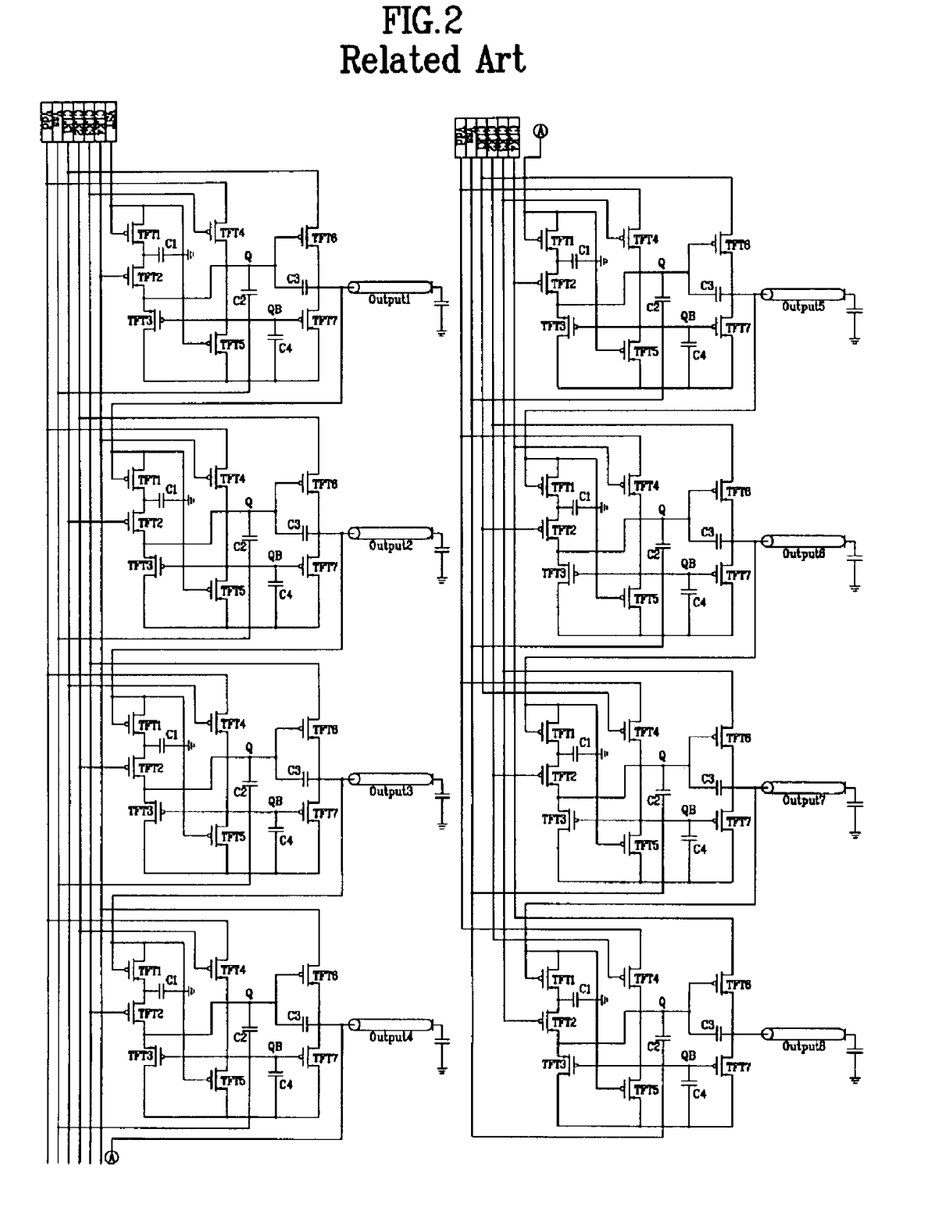
FIG. 2 is a circuit diagram of a shift register of the related art LCD panel.

FIG. 2 is a circuit diagram of the shift register of the related art LCD panel.

A gate pulse or a data start pulse Vst, first to fourth clock signals CLK1, CLK2, CLK3, and CLK4 of different phases, and first and second power source voltages Vdd and Vss are input to an input terminal of the shift register.

The circuit structure of the shift register includes eight blocks having a similar structure to one another except for the location where a clock signal is applied.

The first block includes a first p-MOS transistor TFT1, a second p-MOS transistor TFT2, a third p-MOS transistor TFT3, a fourth p-MOS transistor TFT4, a fifth p-MOS transistor TFT5, a sixth p-MOS transistor TFT6, and a seventh p-MOS transistor TFT7.

The first p-MOS transistor TFT1 has source and gate terminals to which the start pulse Vst is applied. The second p-MOS transistor TFT2 has a source terminal connected to a drain terminal of the first p-MOS transistor TFT1, and a gate terminal to which the fourth clock signal CLK4 is applied. The third p-MOS transistor TFT3 has a source terminal connected to a drain terminal of the second p-MOS transistor TFT2, and a drain terminal connected to the Vss terminal. The fourth p-MOS transistor TFT4 has a source terminal connected to the Vdd terminal, a gate terminal connected to the third clock signal CLK3, and a drain terminal connected to the gate terminal of the third p-MOS transistor TFT3. The fifth p-MOS transistor TFT5 has a source terminal connected to the drain terminal of the fourth p-MOS transistor TFT4, a gate terminal connected to the start pulse Vst, and a drain terminal connected to the Vss terminal. The sixth p-MOS transistor TFT6 has a source terminal connected to the first clock signal CLK1, a gate terminal connected to a drain terminal of the second p-MOS transistor TFT2, and a drain terminal connected to the output terminal. The seventh p-MOS transistor TFT7 has a source terminal connected to the output terminal, a gate terminal connected to the drain of the fourth p-MOS transistor TFT4, and a drain terminal connected to the Vss terminal.

A contact node between the drain terminal of the first p-MOS transistor TFT1 and the source terminal of the second p-MOS transistor TFT2 is connected to the Vss terminal through a first capacitor C1. The gate terminal of the sixth p-MOS transistor TFT6 is connected to the Vss terminal through a second capacitor C2. The gate terminal and the drain terminal of the sixth p-MOS transistor TFT6 are connected to one another through a third capacitor C3. The gate terminal of the seventh p-MOS transistor TFT7 is connected to the Vss terminal through a fourth capacitor C4.

The clock signals are differently applied to each source terminal of the sixth p-MOS transistor TFT6, each gate terminal of the fourth p-MOS transistor TFT4, and each gate terminal of the second p-MOS transistor TFT2, respectively corresponding to second to eighth blocks. Also, an output terminal of the previous block is connected to the source and gate terminals of the first p-MOS transistor TFT1.

In other words, the clock signals are applied to the first block to the eighth block as explained in the following description.

The first clock signal CLK1 is applied to the source terminal of each sixth p-MOS transistor TFT6 in the first block and the fifth block. The second clock signal CLK2 is applied to the source terminal of the sixth p-MOS transistor TFT6 in both the second block and the sixth block. The third clock signal CLK3 is applied to the source terminal of TFT6 in both the third block and the seventh block. The fourth clock signal CLK4 is applied to the source terminal of the sixth p-MOS transistor TFT6 in both the fourth block and the eighth block.

Further, in the first and fifth blocks, the third clock signal CLK3 is applied to the gate terminal of the fourth p-MOS transistor TFT4. In both the second and sixth blocks, the fourth clock signal CLK4 is applied to the gate terminal of the fourth p-MOS transistor TFT4. In both the third and seventh blocks, the first clock signal CLK1 is applied to the gate terminal of the fourth p-MOS transistor TFT4. In both the fourth and eighth blocks, the second clock signal CLK2 is applied to the gate terminal of the fourth p-MOS transistor TFT4.

In both the first and fifth blocks, the fourth clock signal CLK4 is applied to the gate terminal of the second p-MOS transistor TFT2. In both the second and sixth blocks, the first clock signal CLK1 is applied to the gate terminal of the second p-MOS transistor TFT2. In both the third and seventh blocks, the second clock signal CLK2 is applied to the gate terminal of the second p-MOS transistor TFT2. In both the fourth and eighth blocks, the third clock signal CLK3 is applied to the gate terminal of the second p-MOS transistor TFT2.

The operation of the aforementioned shift register of the related art LCD panel will be described as follows.

Figure 3:
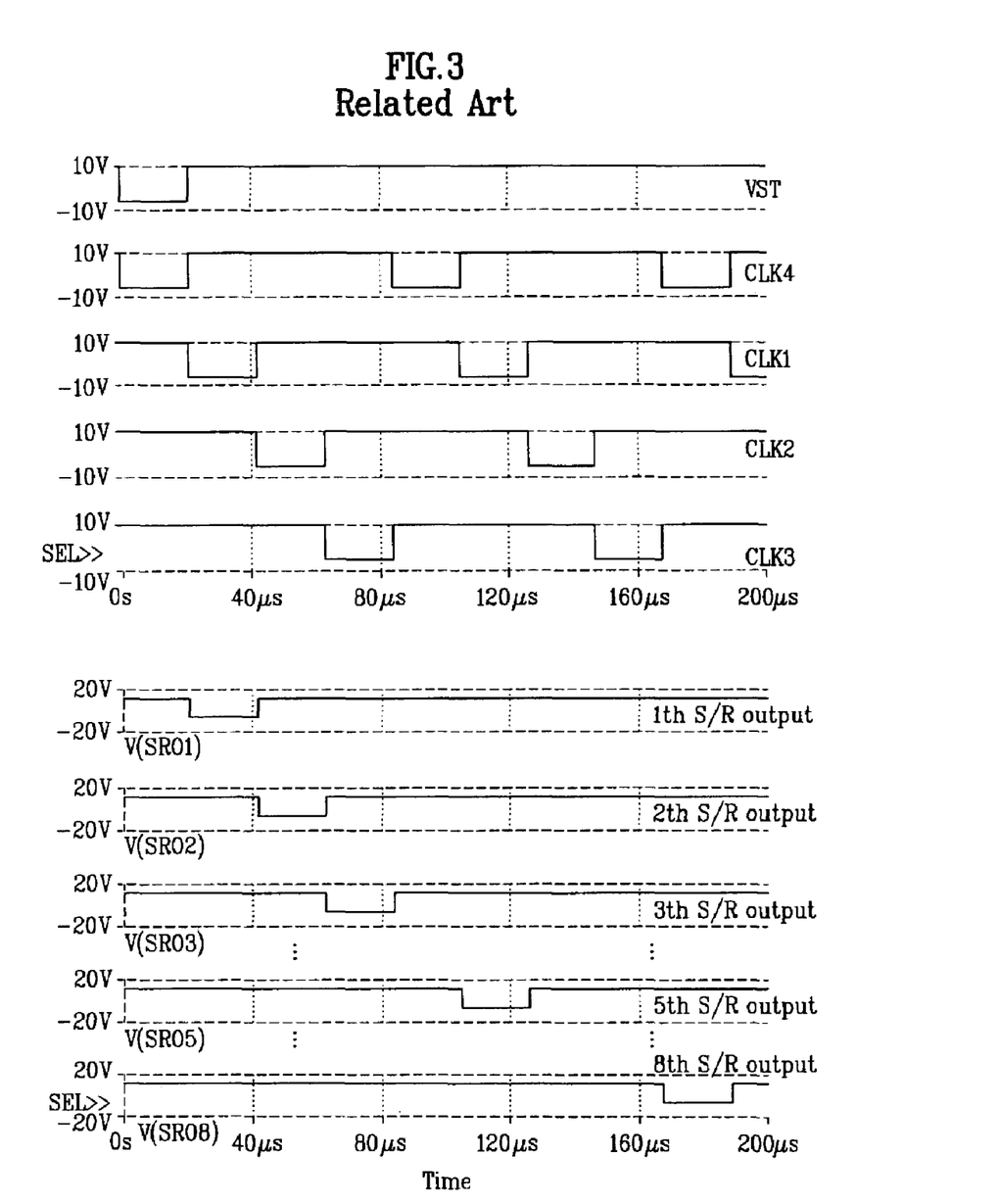
FIG. 3 illustrates input and output waveforms of the shift register of the related art LCD panel.

FIG. 3 illustrates input and output waveforms of the shift register of the related art LCD panel.

First, the operation of the first block will be described.

The first p-MOS transistor TFT1 is turned on when a low level start pulse Vst is input in a switch-on state. At this point, since the fourth clock signal CLK4 is input at a low level in a switch-on state, the second p-MOS transistor TFT2 is also turned on. Accordingly, the node Q becomes a low level in a switch-on state, thereby turning on the sixth p-MOS transistor TFT6 and outputting the first clock signal CLK1 to the output terminal accordingly. In addition, since a node QB is at a high level in a switch-off state, the seventh p-MOS transistor TFT7 is turned off. Thus, the Vss voltage is not applied to the output terminal.

Similarly, in the second block, since the output of the first block is at a low level, and the first clock signal is at a low level, the second clock signal CLK2 is applied to the source terminal of the sixth p-MOS transistor TFT6.

As shown in FIG. 3, the outputs are sequentially generated from the first block to the eighth block.

However, the related art LCD panel having the driving circuit has the following disadvantages.

For example, picture images can be scanned only in an originally designed direction and not in the opposite direction. In other words, the output is generated in the order of the last block to the first block and cannot be generated in the order of the first block to the last block. In this case, it is difficult to set an arbitrary direction of the LCD panel, for example, in a landscape or a portrait type orientation. Therefore, the system manufacturers require different panels, thereby limiting the use of the related art LCD panels. Also, a waveform output from each stage fails to reach a desired level, thereby causing problems in driving the related art LCD panel.

SUMMARY OF THE INVENTION

Accordingly, the present invention is directed to a bi-directional driving circuit of a flat panel display device and method for driving the same that substantially obviates one or more of problems due to limitations and disadvantages of the related art.

Another object of the present invention is to provide a bi-directional driving circuit of a flat panel display device and method for driving the same, which can scan in forward and backward directions without an additional input pad, by including a shift register and a level shifter for obtaining a driving waveform.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a bi-directional driving circuit of a flat panel display device having a plurality of blocks driven by a start pulse Vst, first to fourth clock signals of different phases CLK1, CLK2, CLK3, and CLK4, and first to second power source voltages Vdd and Vss, each block includes a shift register comprising a first control part charging the start pulse Vst or an output signal of a previous block to a first node Q according to either one of the first to fourth clock signals or a second node QB, a second control part controlling the second node QB according to the start pulse Vst, either the output signal of the previous block or an output signal of the next block, and one of the first to fourth clock signals, a third control part charging the start pulse Vst or the output signal of the next block to the first node Q according to either one of the first to fourth clock signals, or controlling the second node QB, and a buffer outputting one of the first to fourth clock signals as a shift pulse according to the first and second nodes Q and QB; and a level shifter shifting a level of the shift pulse output from the shift register in each block, and outputting the shifted level.

The first control part includes a first switching element receiving and outputting the start pulse Vst or the output signal of the previous block, a second switching element charging an output of the first switching element to the first node Q according to one of the first to fourth clock signals, and a third switching element connecting the first node Q to the terminal of the second power source voltage Vss according to the second node QB.

The second control part includes a fourth switching element outputting the first power source voltage Vdd to the second node QB according to one of the first to fourth clock signals, a fifth switching element connecting the second node QB to a terminal of the second power source voltage Vss according to the start pulse Vst, the output signal of the previous block, or the output signal of the next block; and an eighteenth switching element connecting a gate of the fifth switching element to the terminal of the second power source voltage Vss according to one of the first to fourth clock signals identical to the clock signal of the fourth switching element.

The third control part includes a sixteenth switching element receiving and outputting the start pulse Vst or the output signal of the next block, and a seventeenth switching element charging a signal output from the sixteenth switching element to the first node Q according to one of the first to fourth clock signals.

The buffer includes a sixth switching element receiving and outputting one of the first to fourth clock signals to an output terminal of the shift register according to the first node Q, a seventh switching element outputting the first power source voltage Vdd to the output terminal of the shift register according to the second node QB, a first capacitor CB connected between a gate of the sixth switching element and the output terminal for boostrapping the first node Q by a coupling phenomenon, and a second capacitor CQB connected between the second node QB and a terminal of the second power source voltage Vss for preventing a voltage distortion of the second node QB by a current leakage of the fifth switching element.

The level shifter includes a fourth control part outputting a negative voltage Vneg to a third node QL according to the first node Q of the shift register, an output part shifting an output level of the shift register according to one of the first to fourth clock signals identical to a clock signal of the third control part and the third node QL, and outputting the shifted level to an output terminal of the level shifter, a first reset part connecting the third node QL to a terminal of the second power source voltage Vss according to one of the first to fourth clock signals identical to a clock signal of the first control part or one of the first to fourth clock signals identical to the clock signal of the third control part, a second reset part making a potential of the third node QL to be equal to that of the output terminal of the level shifter according to one of the first to fourth clock signals identical to the clock signal of the third control part of the shift register or the second node QB of the shift register, and a third reset part connecting the output terminal of the level shifter to the terminal of the second power source voltage Vss according to the first clock signal of the first control part of the shift register or the second node QB of the shift register.

The fourth control part includes an eighth switching element outputting the negative voltage Vneg in a forward direction, and a ninth switching element outputting the negative voltage Vneg output from the eighth switching element to the third node QL according to the first node Q.

The output part includes a tenth switching element outputting the negative voltage Vneg to the output terminal of the level shifter according to the third node QL, a twentieth switching element outputting the second power source voltage Vss to the output terminal of the level shifter according to one of the first to fourth clock signals identical to the clock signal of the third control part, and a capacitor CL1 turning on the tenth switching element by boostrapping the third node QL by a coupling phenomenon.

The first reset part includes a fifteenth switching element connecting the third node QL to a terminal of the second power source voltage Vss according to one of the first to fourth clock signals identical to the clock signal of the first control part in the shift register, and a nineteenth switching element connecting the third node QL to the terminal of the second power source voltage Vss according to one of the first to fourth clock signals identical to the clock signal of the third control part in the shift register.

The second reset part includes an eleventh switching element making a potential of the third node QL to be equal to that of the output terminal of the level shifter according to one of the first to fourth clock signals identical to the clock signal of the third control part in the shift register, and a twelfth switching element making the potential of the third node QL to be equal to that of the output terminal of the level shifter according to the second node QB in the shift register.

The third reset part includes a thirteenth switching element connecting the output terminal of the level shifter to the terminal of the second power source voltage Vss according to one of the first to fourth clock signals identical to the clock signal of the first control part in the shift register, and a fourteenth switching element connecting the output terminal of the level shifter to the terminal of the second power source voltage Vss according to the second node QB in the shift register.

The plurality of blocks are (4n) blocks (wherein 'n' is a natural number) including (4n−3)th block where the fourth clock signal CLK4 is applied to the first control part thereof, the third clock signal CLK3 is applied to the second control part thereof, the second clock signal CLK2 is applied to the third control part thereof, and the first clock signal CLK1 is applied to the buffer thereof, (4n−2)th block where the first clock signal CLK1 is applied to the first control part thereof, the fourth clock signal CLK4 is applied to the second control part thereof, the third clock signal CLK3 is applied to the third control part thereof, and the second clock signal CLK2 is applied to the buffer thereof, (4n−1)th block where the second clock signal CLK2 is applied to the first control part thereof, the first clock signal CLK1 is applied to the second control part thereof, the fourth clock signal CLK4 is applied to the third control part thereof, and the third clock signal CLK3 is applied to the buffer thereof, and (4n)th block where the third clock signal CLK3 is applied to the first control part thereof, the second clock signal CLK2 is applied to the second control part thereof, the first clock signal CLK1 is applied to the third control part thereof, and the fourth clock signal CLK4 is applied to the buffer thereof.

In another aspect of the present invention, a method for driving a bi-directional driving circuit of a flat panel display device having (4n) blocks (wherein 'n' is a natural number) driven by a start pulse Vst, first to fourth clock signals of different phases CLK1, CLK2, CLK3, and CLK4, and first and second power source voltages Vdd and Vss, each block comprising a shift register having a first control part charging the start pulse Vst or an output signal of a previous block to a first node Q according to one of the first to fourth clock signals or a second node QB, a second control part controlling the second node QB according to the start pulse Vst, the output signal of the previous block or an output signal of the next block, and one of the first to fourth clock signals, a third control part charging the start pulse Vst or the output signal of the next block to the first node Q according to one of the first to fourth clock signals, or controlling the second node QB, and a buffer outputting one of the first to fourth clock signals as a shift pulse according to the first and second nodes Q and QB; and a level shifter shifting a level of the shift pulse output from the shift register in each block, and outputting the shifted level, the method for driving the bi-directional driving circuit, includes applying the fourth clock signal CLK4 to the first control part of a (4n−3)th block, applying the third clock signal CLK3 to the second control part of the (4n−3)th block, applying the second clock signal CLK2 to the third control part of the (4n−3)th block, applying the first clock signal CLK1 to the buffer of the (4n−3)th block, applying the first clock signal CLK1 to the first control part of a (4n−2)th block, applying the fourth clock signal CLK4 to the second control part of the (4n−2)th block, applying the third clock signal CLK3 to the third control part of the (4n−2)th block, applying the second clock signal CLK2 to the buffer of the (4n−2)th block, applying the second clock signal CLK2 to the first control part of a (4n−1)th block, applying the first clock signal CLK1 to the second control part of the (4n−1)th block, applying the fourth clock signal CLK4 to the third control part of the (4n−1)th block, applying the third clock signal CLK3 to the buffer of the (4n−1)th block, applying the third clock signal CLK3 to the first control part of a (4n)th block, applying the second clock signal CLK2 to the second control part of the (4n)th block, applying the first clock signal CLK1 to the third control part of the (4n)th block, and applying the fourth clock signal CLK4 is applied to the buffer of the (4n)th block, wherein, in a forward drivig, the first clock signal CLK1, the second clock signal CLK2, the third clock signal CLK3, and the fourth clock signal CLK4 are sequentially input and repeated, and the fourth clock signal CLK4 is input when the start pulse Vst is input.

In a further aspect of the present invention, a method for driving a bi-directional driving circuit of a flat panel display device having (4n) blocks (wherein 'in' is a natural number) driven by a start pulse Vst, first to fourth clock signals having of phases CLK1, CLK2, CLK3, and CLK4, and first and second power source voltages Vdd and Vss, each block comprising a shift register having a first control part charging the start pulse Vst or an output signal of a previous block to a first node Q according to one of the first to fourth clock signals or a second node QB, a second control part controlling the second node QB according to the start pulse Vst, the output signal of the previous block or an output signal of the next block, and one of the first to fourth clock signals, a third control part charging the start pulse Vst or the output signal of the next block to the first node Q according to one of the first to fourth clock signals, or controlling the second node QB, and a buffer outputting one of the first to fourth clock signals as a shift pulse according to the first and second nodes Q and QB; and a level shifter shifting a level of the shift pulse output from the shift register in each block, and outputting the shifted level, the method for driving the bi-directional driving circuit, includes applying the fourth clock signal CLK4 to the first control part of a (4n−3)th block, applying the third clock signal CLK3 to the second control part of the (4n−3)th block, applying the second clock signal CLK2 to the third control part of the (4n−3)th block, applying the first clock signal CLK1 to the buffer of the (4n−3)th block, applying the first clock signal CLK1 to the first control part of a (4n−2)th block, applying the fourth clock signal CLK4 to the second control part of the (4n−2)th block, applying the third clock signal CLK3 to the third control part of the (4n−2)th block, applying the second clock signal CLK2 to the buffer of the (4n−2)th block, applying the second clock signal CLK2 to the first control part of a (4n−1)th block, applying the first clock signal CLK1 to the second control part of the (4n−1)th block, applying the fourth clock signal CLK4 to the third control part of the (4n−1)th block, applying the third clock signal CLK3 to the buffer of the (4n−1)th block, applying the third clock signal CLK3 to the first control part of a (4n)th block, applying the second clock signal CLK2 to the second control part of the (4n)th block, applying the first clock signal CLK1 to the third control part of the (4n)th block, and applying the fourth clock signal CLK4 to the buffer of the (4n)th block, wherein, in a backward driving, the fourth clock signal CLK4, the third clock signal CLK3, the second clock signal CLK2, and the first clock signal CLK1 are sequentially input and repeated, and the first clock signal CLK1 is input when the start pulse Vst is input, in case of a backward driving.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

A bi-directional driving circuit of a flat panel display device and method for driving the same according to the present invention will be described with reference to the accompanying drawings.

Figure 4A:
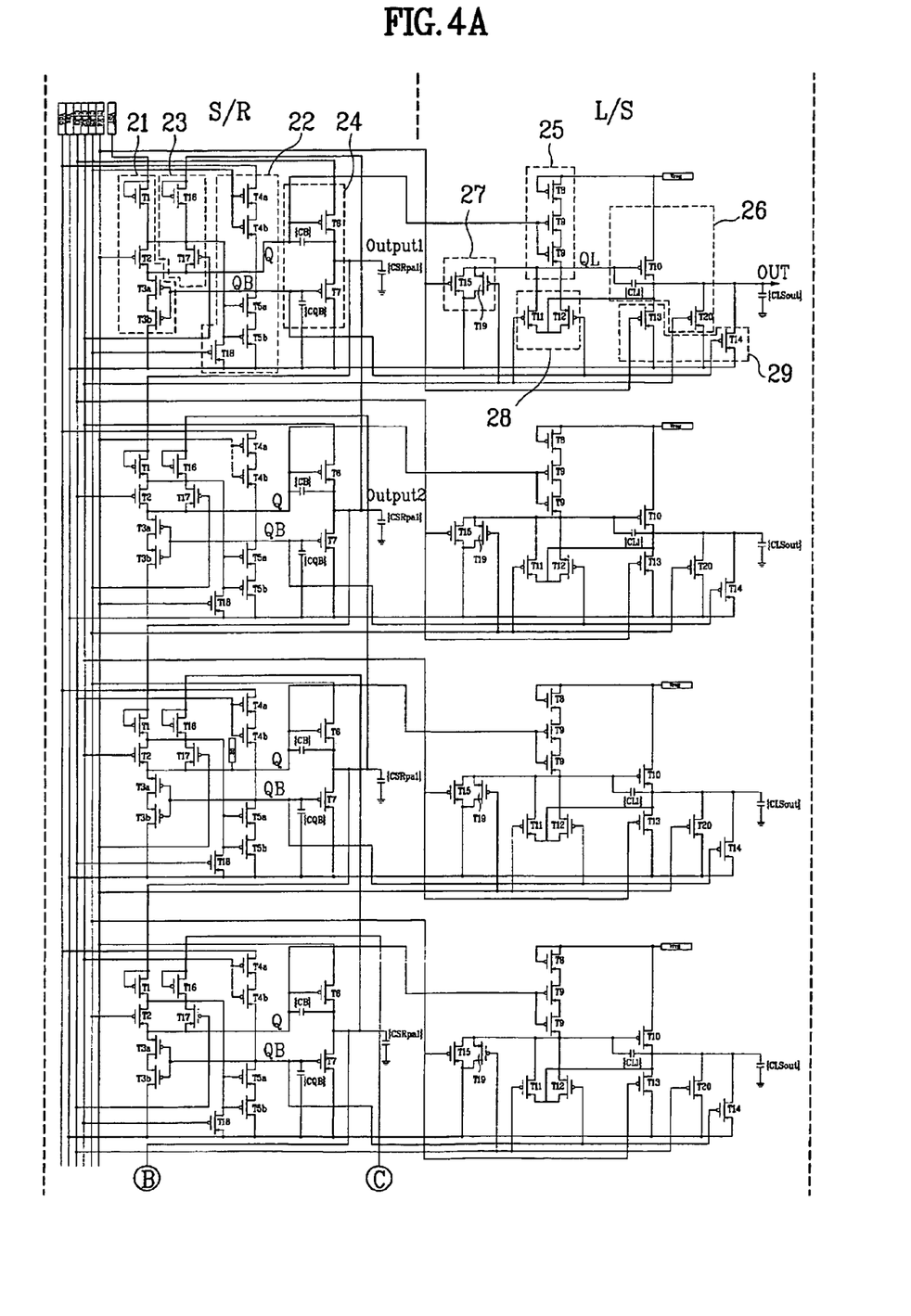
FIGS. 4A and 4B are circuit diagrams of a bi-directional driving circuit of a flat panel display device having a shift register and a level shifter according to a first embodiment of the present invention.
Figure 4B:
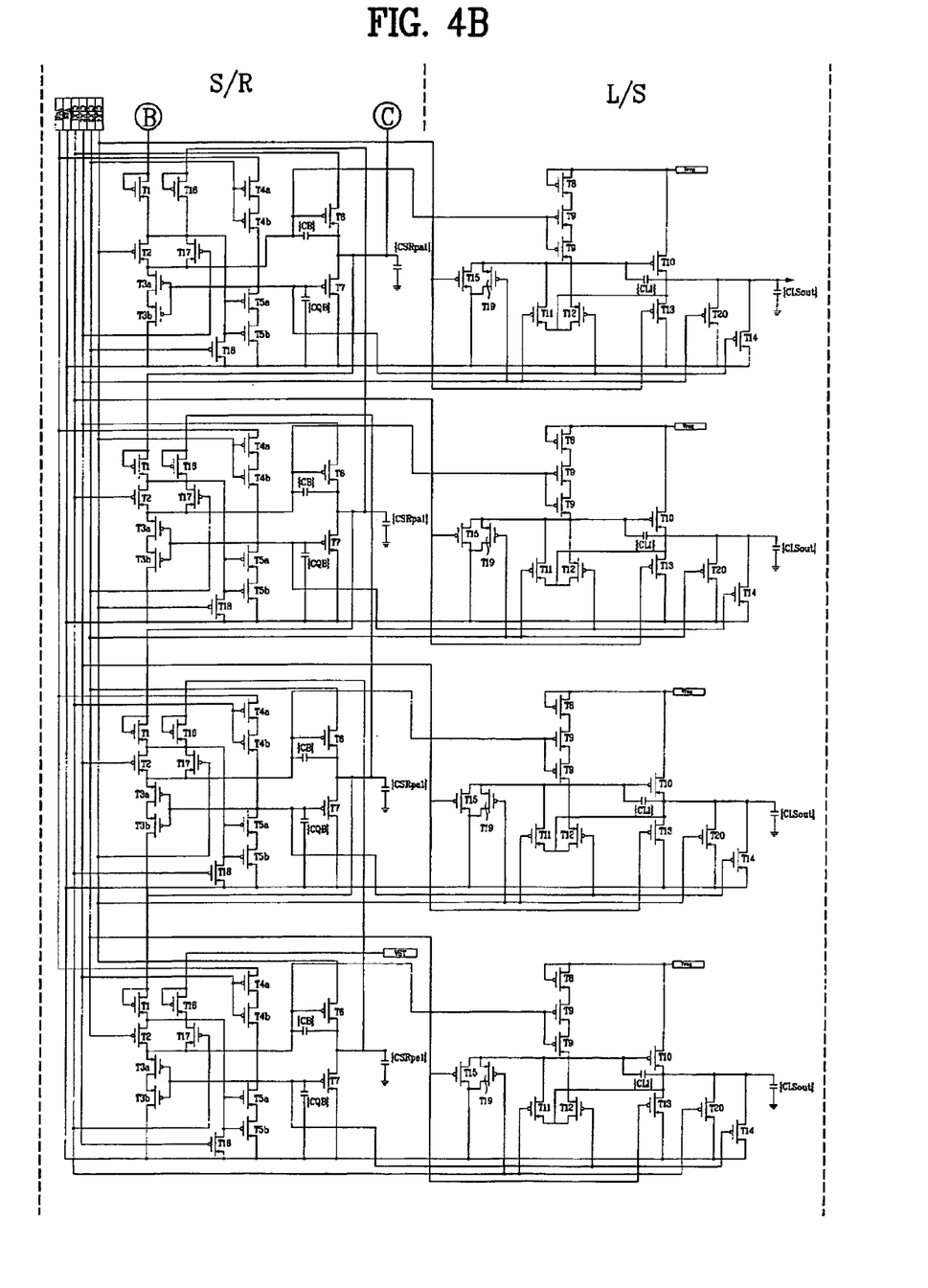

FIGS. 4A and 4B are circuit diagrams of a bi-directional driving circuit of a flat panel display device including a liquid crystal display device having a shift register and a level shifter according to a first embodiment of the present invention.

First, a gate or data start pulse Vst, first to fourth clock signals CLK1, CLK2, CLK3, and CLK4 of different phases, and first and second power source voltages Vdd and Vss are input to an input terminal of a shift register.

A circuit structure of the shift register includes (4n) blocks (wherein 'n' indicates a natural number, and eight blocks are shown in FIG. 4 as an example) having a structure similar to one another except for the location where the clock signals are applied.

Each block will be described as follows.

Each block includes a shift register S/R and a level shifter L/S.

More specifically, the shift register S/L includes a first control part 21, a second control part 22, a third control part 23, and a buffer 24. Herein, the first control part 21 including a first p-MOS transistor to third p-MOS transistors T1, T2, T3a, and T3b outputs a start pulse Vst or an output signal of the previous block to a first node Q according to one of first to fourth clock signals or a second node QB. The second control part 22 including fourth p-MOS transistors T4a and T4b, fifth p-MOS transistors T5a and T5b, and an eighteenth p-MOS transistor T18 controls the second node QB according to one of the start pulse Vst, the output signal of the previous block, an output signal of the next block, and one of the first to fourth clock signals. The third control part 23 including a sixteenth p-MOS transistor T16 and a seventeenth p-MOS transistor T17 outputs the start pulse Vst or the output signal of the next block to the first node Q, or controls the second node QB according to one of the first to fourth clock signals. The buffer 24 including a sixth p-MOS transistor T6, a seventh p-MOS transistor T7, and capacitors CB and CQB outputs one of the first to fourth clock signals as a shift pulse according to the first node Q and the second node QB.

The first control part 21 includes the first p-MOS transistor T1 receiving and outputting the start pulse Vst or the output signal of the previous block, the second p-MOS transistor T2 charging the output from the first p-MOS transistor T1 as a control signal to the first node QB according to one of the first to fourth clock signals, and the two third p-MOS transistors T3a and T3b connecting an output terminal of the second p-MOS transistor T2 to the Vss terminal according to the second node QB. The third p-MOS transistor T3 has a dual gate structure of T3a and T3b so as to prevent current leakage.

The second control part 22 includes the two fourth p-MOS transistors T4a and T4b each having a gate to which one of the first to fourth clock signals is applied, and serially connected to output the Vdd to the second node QB, the two fifth p-MOS transistors T5a and T5b connecting the second node QB to the Vss terminal according to the output signal of either the previous block or the next block, and the eighteenth p-MOS transistor T18 connecting outputs of the first p-MOS transistor T1 and the sixth p-MOS transistor T6 to the Vss terminal according to the clock signal identical to those of the fourth p-MOS transistors T4a and T4b. The fourth P-MOS transistors T4a and T4b and the fifth p-MOS transistors T5a and T5b have the dual gate structures so as to prevent current leakage.

The third control part 23 includes the sixteenth p-MOS transistor T16 receiving and outputting the start pulse Vst or the output signal of the next block, and the seventeenth p-MOS transistor T17 charging a signal output from the sixteenth p-MOS transistor T16 to the first node QB according to one of the first to fourth clock signals.

The buffer 24 includes the sixth p-MOS transistor T6 receiving and outputting one of the first to fourth clock signals to the output terminal according to the first node Q, the seventh p-MOS transistor T7 outputting the power source voltage Vss to the output terminal of the shift register (Output 1, Output2, . . . ) according to the second node QB, the capacitor CB connected between the gate of the sixth p-MOS transistor T6 and the output terminal for boostrapping the first node Q by a coupling phenomenon, and the capacitor CQB connected between the second node QB and the Vss terminal for preventing a voltage distortion of the second node QB caused by current leakage in the fifth p-MOS transistor T5.

Also, the level shifter L/S includes a fourth control part 25 having an eighth p-MOS transistor T8 and ninth p-MOS transistors T9a and T9b outputting a negative voltage Vneg to a third node QL according to the first node Q of the shift register S/R, an output part 26 having a tenth p-MOS transistor T10, a thirteenth p-MOS transistor T13, and a capacitor CL1 shifting the output level of the shift register S/R according to the third node QL and the clock signal identical to that of the first control part 21, and outputting the shifted output level to an output terminal OUT, a first reset part 27 having a fifteenth p-MOS transistor T15 and a nineteenth p-MOS transistor T19 connecting the third node QL to the Vss terminal according to the clock signal identical to those of the first control part 21 and the third control part 23 of the shift register S/R, a second reset part 29 having an eleventh p-MOS transistor T11 and a twelfth p-MOS transistor T12 making a potential of the third node QL to be equal to that of the output terminal OUT of the level shifter according to the clock signal identical to that of the third control part 23 of the shift register S/R or the second node QB of the shift register S/R, and a third reset part 29 including a thirteenth p-MOS transistor T13 and a fourteenth p-MOS transistor T14 connecting the output terminal OUT of the level shifter L/S to the Vss terminal according to the clock signal identical to that of the first control part 21 of the shift register S/R or the second node QB of the shift register S/R.

The fourth control part 25 includes the eighth p-MOS transistor T8 outputting the negative voltage Vneg in a forward direction, and the two ninth p-MOS transistors T9a and T9b outputting the negative voltage Vneg output from the eighth p-MOS transistor T8 to the third node QL according to the first node Q of the shift register S/R. The ninth p-MOS transistor T9 has a dual gate structure of T9a and T9b so as to prevent current leakage.

The output part 26 includes the tenth p-MOS transistor T10 outputting the negative voltage Vneg to the output terminal OUT of the level shifter L/S according to the third node QL, the twentieth p-MOS transistor T20 outputting the power source voltage Vss to the output terminal of the level shifter L/S according to the clock signal identical to that of the third control part 34 in the shift register S/R, and the capacitor CL1 turning on the tenth p-MOS transistor T10 by boostrapping the third node QL by a coupling phenomenon.

A first reset part 27 includes the fifteenth p-MOS transistor T15 connecting the third node QL to the Vss terminal according to the clock signal identical to that of the first control part 21 in the shift register S/R, and the nineteenth p-MOS transistor T19 connecting the third node QL to the Vss terminal according to the clock signal identical to that of the third control part 23 in the shift register S/R.

A second reset part 29 includes the eleventh p-MOS transistor T11 making a potential of the third node QL to be equal to that of the output terminal OUT of the level shifter L/S according to the clock signal identical to that of the third control part 23 in the shift register S/R, and the twelfth p-MOS transistor T12 making a potential of the third node QL to be equal to that of the output terminal OUT of the level shifter according to the second node QB in the shift register S/R.

A third reset part 29 includes the thirteenth p-MOS transistor T13 connecting the output terminal OUT of the level shifter L/S to the Vss terminal according to the clock signal identical to that of the first control part 21 in the shift register S/R, and the fourteenth p-MOS transistor T14 connecting the output terminal OUT of the level shifter L/S to the Vss terminal according to the second node QB in the shift register S/R. In this structure, different clock signals are applied to the respective blocks.

When the bi-directional driving circuit of the flat panel display device according to the present invention is composed of (4n) blocks, the structure of the bi-directional driving circuit will be described as follows.

In the (4n−3)th block (wherein 'n' is a natural number), the fourth clock signal CLK4 is applied to the first control part 21, the third clock signal CLK3 is applied to the second control part 22, the second clock signal CLK2 is applied to the third control part 23, and the first clock signal CLK1 is applied to the buffer 24. In the (4n−2)th block (wherein 'in' is a natural number), the first clock signal CLK1 is applied to the first control part 21, the fourth clock signal CLK4 is applied to the second control part 22, the third clock signal CLK3 is applied to the third control part 23, and the second clock signal CLK2 is applied to the buffer 24. In the (4n−1)th block (wherein 'n' is a natural number), the second clock signal CLK2 is applied to the first control part 21, the first clock signal CLK1 is applied to the second control part 22, the fourth clock signal CLK4 is applied to the third control part 23, and the third clock signal CLK3 is applied to the buffer 24. In the (4n)th block (wherein 'n' is a natural number), the third clock signal CLK3 is applied to the first control part 21, the second clock signal CLK2 is applied to the second control part 22, the first clock signal CLK1 is applied to the third control part 23, and the fourth clock signal CLK4 is applied to the buffer 24.

The bi-directional driving circuit of the flat panel display device according to the present invention is operated as follows.

Figure 5:
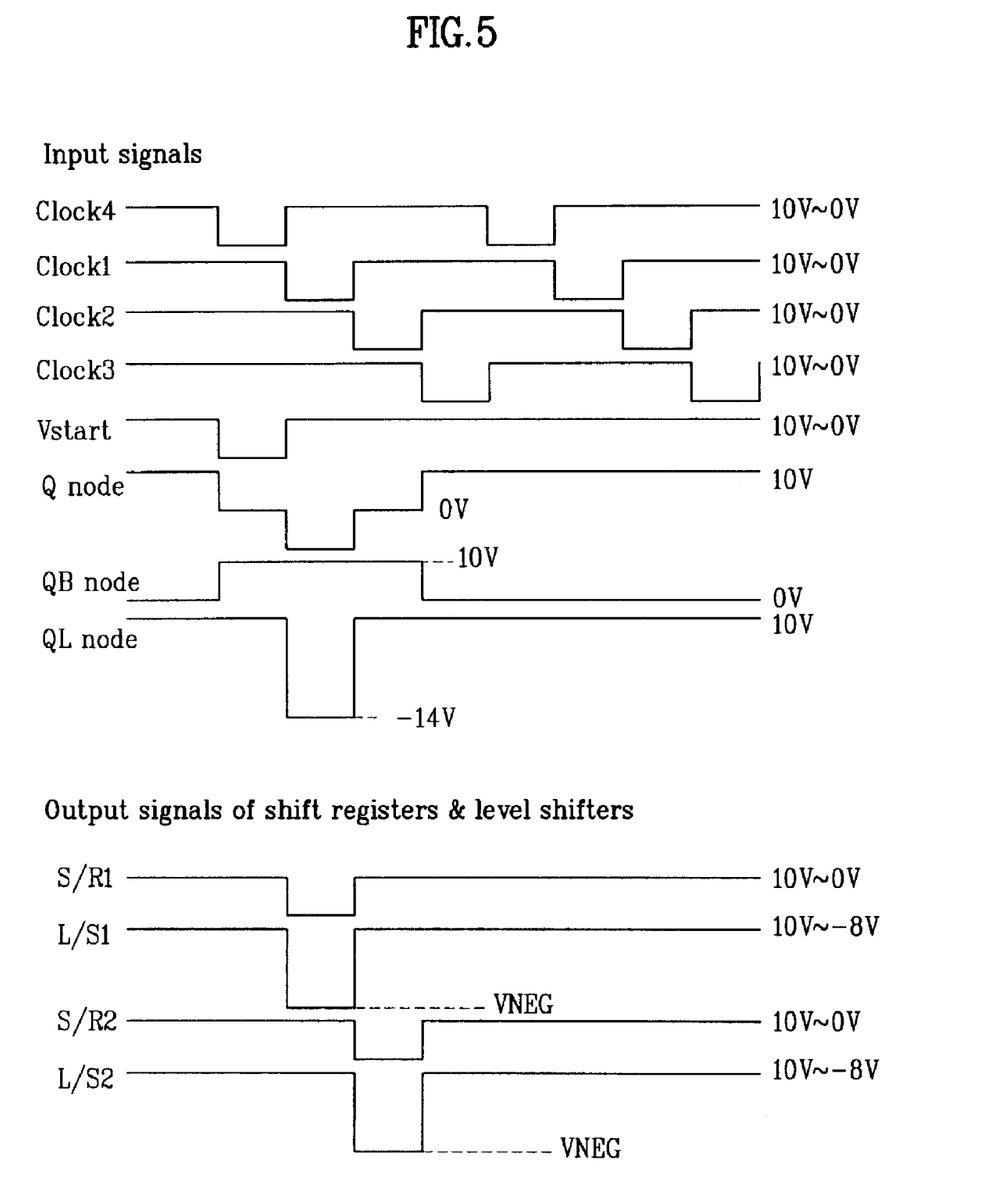
FIG. 5 illustrates voltage levels of input clock signals, a first node Q, a second node QB, and a third node QL, and output waveforms of level shifters L/S and shift registers S/R during a forward driving in the bi-directional driving circuit of the flat display panel device according to the present invention.

FIG. 5 illustrates voltage levels of input clock signals, a first node Q, a second node QB, and a third node QL, and waveforms of the shift register and the level shifter during the forward driving in the bi-directional driving circuit of the flat panel display device according to the present invention. In the present invention, the first to fourth clock signals CLK1, CLK2, CLK3, and CLK4 swing in 10V (for example, 10V~0V) are input so as to operate the shift register S/R. When the output of the shift register S/R passes through the level shifter L/S, the output is shifted to the swing voltage of 10V or more (for example, 10V~−8V), and is then output, thereby driving gate and data drivers bi-directionally.

In the case of the forward driving, as shown in FIG. 5, the first clock signal CLK1, the second clock signal CLK2, the third clock signal CLK3, and the fourth clock signal CLK4 are sequentially input and repeated. When the start pulse Vst is input, the fourth clock signal CLK4 is input.

The forward operation of the first block will be described as follows.

The first p-MOS transistor TFT1 is turned on when the start pulse Vst is input in a switch-on state (low level, 0V). At this point, since the fourth clock signal CLK4 is input in a switch-on state (low level, 0V), the second p-MOS transistor TFT2 is turned on. Thus, the first node Q becomes a low level in a switch-on state (low level, 0V). This turns on the sixth p-MOS transistor TFT6. As a result, the first clock signal CLK1 is output to the output terminal Output1. Next, the first clock signal CLK1 is in a switch-on state (low level, 0V), and the fourth clock signal CLK4 is in a switch-off state (high level, 10V), so that the first node Q becomes a floating state, thereby causing boostrapping by a coupling phenomenon according to the capacitor CB. Thus, the first node Q becomes higher. As a result, the ninth p-MOS transistors T9a and T9b of the level shifter L/S are turned on, so that the capacitor CL1 and the gate electrode of the tenth p-MOS transistor T10 are charged with the negative voltage Vneg. Thus, the output terminal OUT of the level shifter L/S is charged with the negative voltage Vneg. In this structure, the ninth and tenth p-MOS transistors T9 and T10 are quickly turned on by boostrapping, even though the first node is lost since the thin film transistors are formed to have a high threshold voltage.

Accordingly, the shift register S/R1 of the first block is synchronized with the clock signal CLK1, thereby outputting the swing voltage (for example, 10V~0V) of 10V or less. Also, the level shifter L/S of the first block shifts the level of the output from the shift register S/R1 to the swing voltage (for example, 10V~−8V), and then outputs the voltage of the shifted level.

Similarly, in the second block, the shift register S/R2 and the level shifter L/S2 are synchronized with the second clock signal CLK2, thereby respectively outputting the swing voltage of 10V or less (for example, 10V~0V) and the swing voltage of 10V or more (for example, 10V~−8V).

In the bi-directional driving circuit of the flat panel display device according to the present invention, input and output waveforms will be described in detail for the forward driving and the backward driving in the respective blocks.

Figure 6:
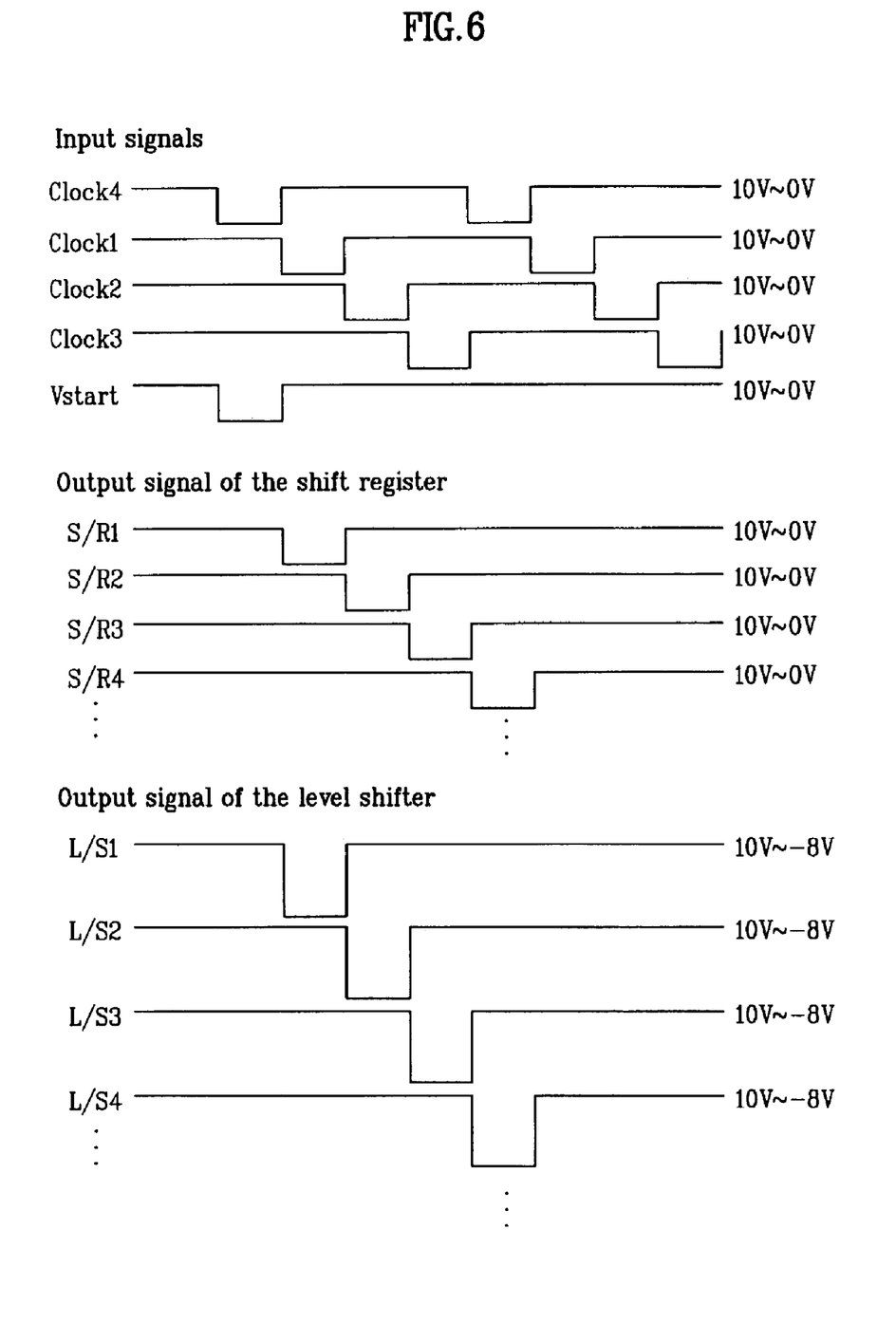
FIG. 6 illustrates input clock signals and output waveforms of a shift register and a level shifter of each block during a forward driving in a bi-directional driving circuit of the flat panel display device according to the present invention.
Figure 7:
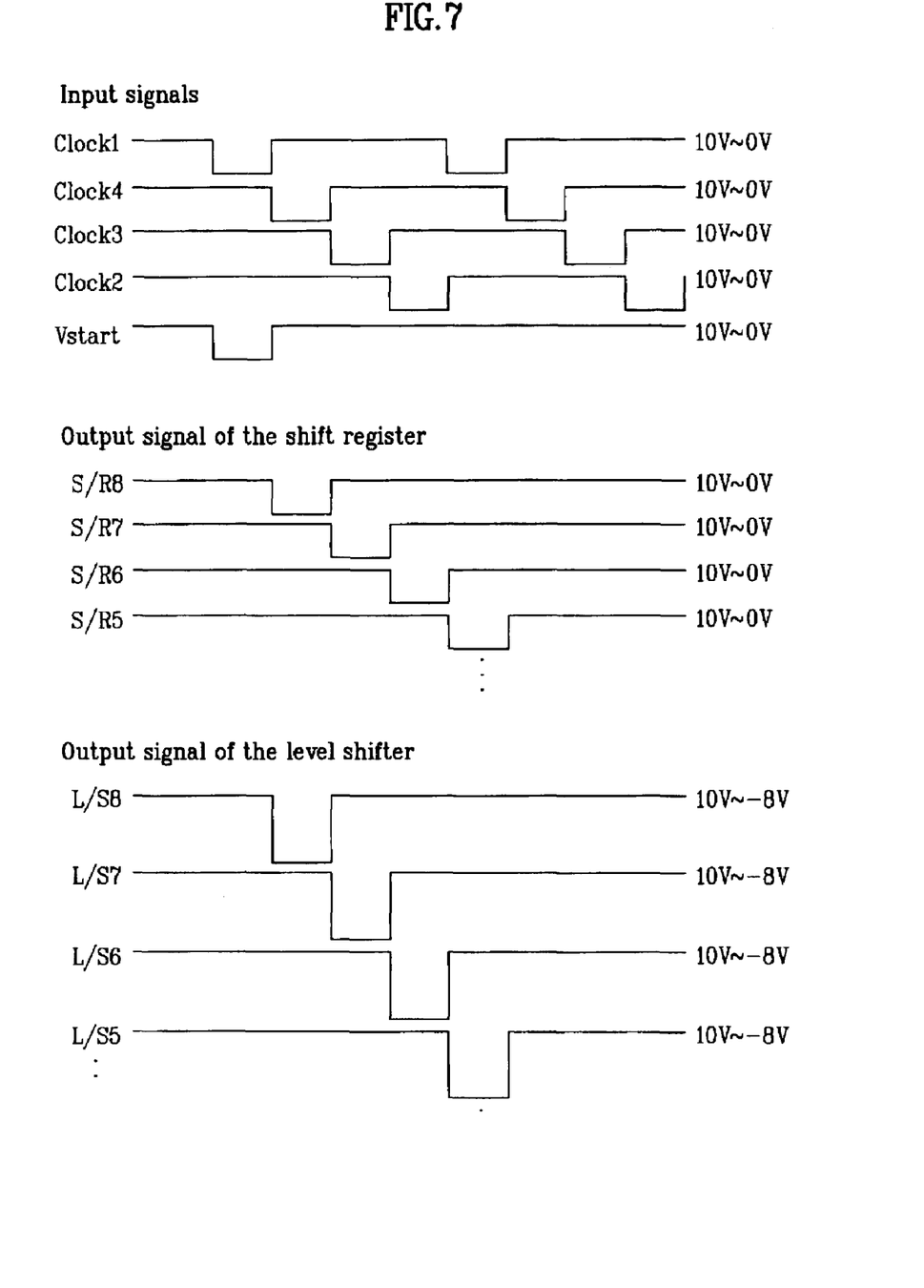
FIG. 7 illustrates input clock signals and output waveforms of a shift register and a level shifter of each block during a backward driving in the bi-directional driving circuit of the flat panel display device according to the present invention.

FIG. 6 illustrates input clock signals and output waveforms of the shift register and the level shifter of each block for the forward driving in the bi-directional driving circuit of the flat panel display device according to the present invention. FIG. 7 illustrates input clock signals and output waveforms of the shift register and the level shifter of each block for the backward driving in the bi-directional driving circuit of the flat panel display device according to the present invention.

As shown in FIG. 6, in the case of the forward driving, the first clock signal CLK1, the second clock signal CLK2, the third clock signal CLK3, and the fourth clock signal CLK4 are sequentially input and repeated. When the start pulse Vst is input, the fourth clock signal CLK4 is input. Meanwhile, as shown in FIG. 7, in the case of the backward driving, the fourth clock signal CLK4, the third clock signal CLK3, the second clock signal CLK2, and the first clock signal CLK1 are sequentially input and repeated. When the start pulse Vst is input, the first clock signal CLK1 is also input.

The forward driving will be described as follows.

When the start pulse Vst is applied as a switch-on state (low level, 0V) to the first p-MOS transistor T1 of the first control part 21 in the first block, and the sixteenth p-MOS transistor T16 of the third control part 23 in the last block, the first p-MOS transistor T1 and the sixteenth p-MOS transistor T16 are turned on. At this point, the fourth clock signal CLK4 is input in a switch-on state (0V), the second p-MOS transistor T2 of the first block is turned on. However, the seventeenth p-MOS transistor T17 of the last block is turned off since the fourth clock signal CLK4 is not applied to the seventeenth p-MOS transistor T17 of the last block. As a result, in the first block, the first node Q is in a switch-on state (0V), so that the sixth p-MOS transistor T6 is turned on, thereby outputting the first clock signal CLK1 to the output terminal Output1. Meanwhile, the sixth p-MOS transistor T6 of the last block is turned off, so that the fourth clock signal CLK4 is not applied to the output terminal Output1. In other words, the start pulse Vst and the fourth clock signal CLK4 are input at the same time, pulses are sequentially output from the first block to the last block, thereby causing the forward driving.

Accordingly, the forward driving of the first block will be described as follows.

The first p-MOS transistor TFT1 of the first control part 21 is turned on when the start pulse Vst is input in a switch-on state (0V). At this point, since the fourth clock signal CLK4 is input in a switch-on state (low level, 0V), the second p-MOS transistor TFT2 is turned on. Thus, the first node Q becomes a low level in a switch-on state (0V). This turns on the sixth p-MOS transistor TFT6. As a result, the first clock signal CLK1 is output to the output terminal Output1. In this state, the start pulse Vst is input in a switch-on state (low level, 0V), so that the two fifth p-MOS transistors T5a and T5b of the second control part 22 are turned on, and the second node QB is charged with the power source voltage Vss. Thus, the two third p-MOS transistors T3a and T3b and the seventh p-MOS transistor T7 having respective gate electrodes connected to the second node QB are turned off. As a result, the second node QB is in a switch-off state (10V), so that the seventh p-MOS transistor T7 is turned off, and does not output the power source voltage Vss to the output terminal Output1. Also, an output of the next terminal is applied to the sixteenth p-MOS transistor T16 of the third control part 23, and the second clock signal CLK2 is applied to the seventeenth p-MOS transistor T17, so that the sixteenth p-MOS transistor T16 and the seventeenth p-MOS transistor T17 are turned off.

Next, when the first clock signal CLK1 is in a switch-on state (low level, 0V), and the fourth clock signal CLK4 is in a switch-off state (high level, 10V), the first node Q is in the floating state, and the boostrapping is caused by a coupling phenomenon according to the capacitor CB. Thus, the gate voltage of the sixth p-MOS transistor T6 becomes higher. According to the aforementioned gate voltage, the ninth p-MOS transistors T9a and T9b of the level shifter L/S are turned on. As a result, the gate electrode of the tenth p-MOS transistor T10 and the capacitor CL1 are charged with the negative voltage Vneg, and the output terminal OUT of the level shifter L/S is charged with the negative voltage Vneg.

Similarly, in the second block, when the output of the shift register S/R1 in the first block is in a switch-on state (0V), and the first clock signal CLK1 is in a switch-on state (0V), the first and second p-MOS transistors T1 and T2 are turned on, so that the first node Q is in a switch-on state (0V). Thus, the sixth p-MOS transistor T6 is turned on, thereby outputting the second clock signal CLK2 to the output terminal Output1.

As described above, in the level shifter L/S2 of the second block, the negative voltage is output to the output terminal. In the same manner, as shown in FIG. 6, the outputs are sequentially generated from the first block to the eighth block.

The backward driving will be described as follows.

When the start pulse Vst is input as a switch-on state (low level, 0V) to the first p-MOS transistor T1 of the first control part 21 in the first block, and the sixteenth p-MOS transistor T16 of the third control part in the last block, thereby turning on the first p-MOS transistor T1 and the sixteenth p-MOS transistor T16. At this point, the first clock signal CLK1 is input in a switch-on state (0V), the second p-MOS transistor T2 of the first block is turned off, and the seventeenth p-MOS transistor T17 of the last block is turned on. Accordingly, in the first block, the first node Q is in a switch-off state (10V), so that the sixth p-MOS transistor T6 is turned off, and does not output the first clock signal CLK1 to the output terminal. Meanwhile, the sixth p-MOS transistor T6 of the last block is turned on, thereby outputting the fourth clock signal CLK4 input to the sixth p-MOS transistor T6 to the output terminal Output1. As described above, the start pulse Vst and the first clock signal CLK1 are input at the same time, so that pulses are sequentially output from the last block to the first block, thereby generating the backward driving.

That is, the operation of the last block will be described as follows.

When the start pulse Vst and the first clock signal CLK1 are input in a switch-on state (0V), the second p-MOS transistor T2 of the first control part 21 is turned off. However, the sixteenth p-MOS transistor T16 and the seventeenth p-MOS transistor T17 of the third control part 23 are turned on, so that the first node Q is in a switch-on state (0V). Thus, the sixth p-MOS transistor T6 is turned on, and the fourth clock signal CLK4 is output to the output terminal Output1. At this time, the start pulse Vst is input as a switch-on state (low level, 0V) through the sixteenth p-MOS transistor T16, so that the two fifth p-MOS transistors T5a and T5b of the second control part 22 are turned on, and the second node QB is charged with the power source voltage Vss. Thus, the two third p-MOS transistors T3a and T3b and the seventh p-MOS transistor T7 having respective gate electrodes connected to the second node QB are turned off. As a result, the second node QB is in a switch-off state (10V), and the seventh p-MOS transistor T7 is turned off, and does not output the power source voltage Vss to the output terminal Output1.

Next, when the fourth clock signal CLK4 is in a switch-on state (low level, 0V), and the first clock signal CLK1 is in a switch-off state (high level, 10V), the first node Q is in the floating state, and the boostrapping is caused by a coupling phenomenon according to the capacitor CB. Thus, the gate voltage of the sixth p-MOS transistor T6 becomes higher. According to the gate voltage, the ninth p-MOS transistors T9a and T9b of the level shifter L/Sn are turned on, and the gate electrode of the tenth p-MOS transistor T10 and the capacitor CL1 are charged with the negative voltage Vneg, so that the output terminal OUT of the level shifter L/S is charged with the negative voltage Vneg.

Similarly, in the previous block of the last block, when the shift register S/R of the last block is in a switch-on state (0V), and the fourth clock signal CLK4 is in a switch-on state (0V), the sixteenth p-MOS transistor T16 and the seventeenth p-MOS transistor T17 are turned on, so that the first node Q is in a switch-on state (0V). Thus, the sixth p-MOS transistor T6 is turned on, thereby outputting the third clock signal CLK3 to the output terminal Output1.

As described above, in the level shifter L/S2, the negative voltage is output to the output terminal.

In this manner, as shown in FIG. 7, the outputs are backward generated from the last block to the first block.

Accordingly, since forward and backward scannings can be implemented without a separate signal or PIN, a panel specific to the system options can be provided. Namely, such a panel is applicable to both a landscape type display and a portrait type display orientations. Also, the bi-directional driving circuit according to the present invention may be applicable not only for the LCD device but also an EL display device and a PDP display device having a driving method similar to that of the LCD device.

Accordingly, the bi-directional driving circuit of the flat panel display device has the following advantages.

The shift register and level shifter according to the present invention can be driven bi-directionally, so that the LCD panel can also be also operated bi-directionally without an additional input PIN. Accordingly, system manufacturers can make the LCD panel having the driving circuit regardless of the location and direction of the panel.

Also, the driving circuit includes a level shifter, so that the number of components of the external circuit can be decreased. Especially, in case of a PMOS panel, the external clock is input with a voltage between 0V and 10V, and a negative clock is generated in the internal circuit, thereby decreasing power consumption.

It will be apparent to those skilled in the art that various modifications and variations can be made in the bi-directional driving circuit of a flat panel display device and method for driving the same of the present invention without departing from the spirit or scope of the inventions. Thus, it is intended that the present invention covers the modifications and variations of this invention provided they come within the scope of the appended claims and their equivalents.

What is claimed is:

1. A bi-directional driving circuit of a flat panel display device having a plurality of blocks driven by a start pulse, first to fourth clock signals of different phases, and first and second power source voltages, each block comprising:

a shift register comprising, a first control part applying either the start pulse or an output signal of a previous block to a first node according to one of the first to fourth clock signals or a signal at the second node, a second control part controlling the second node according to the start pulse, either the output signal of the previous block or an output signal of the next block, and one of the first to fourth clock signals, a third control part applying either the start pulse or the output signal of the next block to the first node according to either one of the first to fourth clock signals or a signal at the second node, and a buffer outputting one of the first to fourth clock signals as a shift pulse according to the first and second nodes; and a level shifter shifting a level of the shift pulse output from the shift register in each block, and outputting the shifted level.

2. The bi-directional driving circuit of claim 1, wherein the first control part comprising:

a first switching element receiving and outputting either the start pulse or the output signal of the previous block;

a second switching element charging an output of the first switching element to the first node according to one of the first to fourth clock signals; and a third switching element connecting the first node to the terminal of the second power source voltage according to the second node.

3. The bi-directional driving circuit of claim 2, wherein the third switching element has a dual gate structure having two elements to prevent a current leakage.

4. The bi-directional driving circuit of claim 1, wherein the second control part comprising:

a fourth switching element outputting the first power source voltage to the second node according to one of the first to fourth clock signals;

a fifth switching element connecting the second node to a terminal of the second power source voltage according to the start pulse, the output signal of the previous block, or the output signal of the next block; and an eighteenth switching element connecting a gate of the fifth switching element to the terminal of the second power source voltage according to one of the first to fourth clock signals identical to the clock signal of the fourth switching element.

5. The bi-directional driving circuit of claim 4, wherein the fourth and fifth switching elements have dual gate structures so as to prevent a current leakage.

6. The bi-directional driving circuit of claim 1, wherein the third control part comprising:

a sixteenth switching element receiving and outputting either the start pulse or the output signal of the next block; and a seventeenth switching element charging a signal output from the sixteenth switching element to the first node according to one of the first to fourth clock signals.

7. The bi-directional driving circuit of claim 1, wherein the buffer comprising:

a sixth switching element receiving and outputting one of the first to fourth clock signals to an output terminal of the shift register according to the first node;

a seventh switching element outputting the first power source voltage to the output terminal of the shift register according to the second node;

a first capacitor connected between a gate of the sixth switching element and the output terminal for boostrapping the first node by a coupling phenomenon; and a second capacitor connected between the second node and a terminal of the second power source voltage for preventing a voltage distortion of the second node by a current leakage of the fifth switching element.

8. The bi-directional driving circuit of claim 1, wherein the level shifter comprising:

a fourth control part outputting a negative voltage to a third node according to the first node of the shift register;

an output part shifting an output level of the shift register according to one of the first to fourth clock signals identical to a clock signal of the third control part and the third node, and outputting the shifted level to an output terminal of the level shifter;

a first reset part connecting the third node to a terminal of the second power source voltage according to one of the first to fourth clock signals identical to a clock signal of the first control part or one of the first to fourth clock signals identical to the clock signal of the third control part;

a second reset part making a potential of the third node to be equal to that of the output terminal of the level shifter according to one of the first to fourth clock signals identical to the clock signal of the third control part of the shift register or the second node of the shift register; and a third reset part connecting the output terminal of the level shifter to the terminal of the second power source voltage according to the first clock signal of the first control part of the shift register or the second node of the shift register.

9. The bi-directional driving circuit of claim 8, wherein the fourth control part comprising:

an eighth switching element outputting the negative voltage in a forward direction; and a ninth switching element outputting the negative voltage output from the eighth switching element to the third node according to the first node.

10. The bi-directional driving circuit of claim 9, wherein the ninth switching element has a dual gate structure having two elements to prevent a current leakage.

11. The bi-directional driving circuit of claim 8, wherein the output part comprising:

a tenth switching element outputting the negative voltage to the output terminal of the level shifter according to the third node;

a twentieth switching element outputting the second power source voltage to the output terminal of the level shifter according to one of the first to fourth clock signals identical to the clock signal of the third control part; and a capacitor turning on the tenth switching element by boostrapping the third node by a coupling phenomenon.

12. The bi-directional driving circuit of claim 8, wherein the first reset part comprising:

a fifteenth switching element connecting the third node to a terminal of the second power source voltage according to one of the first to fourth clock signals identical to the clock signal of the first control part in the shift register; and a nineteenth switching element connecting the third node to the terminal of the second power source voltage according to one of the first to fourth clock signals identical to the clock signal of the third control part in the shift register.

13. The bi-directional driving circuit of claim 8, wherein the second reset part comprising:

an eleventh switching element making a potential of the third node to be equal to that of the output terminal of the level shifter according to one of the first to fourth clock signals identical to the clock signal of the third control part in the shift register; and a twelfth switching element making the potential of the third node to be equal to that of the output terminal of the level shifter according to the second node in the shift register.

14. The bi-directional driving circuit of claim 8, wherein the third reset part comprising:
- a thirteenth switching element connecting the output terminal of the level shifter to the terminal of the second power source voltage according to one of the first to fourth clock signals identical to the clock signal of the first control part in the shift register; and
- a fourteenth switching element connecting the output terminal of the level shifter to the terminal of the second power source voltage according to the second node in the shift register.

15. The bi-directional driving circuit of claim 1, wherein the plurality of blocks are (4n) blocks (wherein 'n' is a natural number) comprising,
- (4n-3)th block where the fourth clock signal is applied to the first control part thereof, the third clock signal is applied to the second control part thereof, the second clock signal is applied to the third control part thereof, and the first clock signal is applied to the buffer thereof,
- (4n-2)th block where the first clock signal is applied to the first control part thereof, the fourth clock signal is applied to the second control part thereof, the third clock signal is applied to the third control part thereof, and the second clock signal is applied to the buffer thereof,
- (4n-1)th block where the second clock signal is applied to the first control part thereof, the first clock signal is applied to the second control part thereof, the fourth clock signal is applied to the third control part thereof, and the third clock signal is applied to the buffer thereof, and
- (4n)th block where the third clock signal is applied to the first control part thereof, the second clock signal is applied to the second control part thereof, the first clock signal is applied to the third control part thereof, and the fourth clock signal is applied to the buffer thereof.

16. A method for driving a bi-directional driving circuit of a flat panel display device having (4n) blocks (wherein 'n' is a natural number) driven by a start pulse, first to fourth clock signals of different phases, and first and second power source voltages, each block comprising a shift register having a first control part applying either the start pulse or an output signal of a previous block to a first node according to one of the first to fourth clock signals or a signal at the second node, a second control part controlling the second node according to the start pulse, the output signal of the previous block or an output signal of the next block, and one of the first to fourth clock signals, a third control part applying either the start pulse or the output signal of the next block to the first node according to one of the first to fourth clock signals or a signal at the second node, and a buffer outputting one of the first to fourth clock signals as a shift pulse according to the first and second nodes; and a level shifter shifting a level of the shift pulse output from the shift register in each block, and outputting the shifted level, the method for driving the bi-directional driving circuit, comprising:
- applying the fourth clock signal to the first control part of a (4n-3)th block, the third clock signal to the second control part of the (4n-3)th block, the second clock signal to the third control part of the (4n-3)th block, and the first clock signal to the buffer of the (4n-3)th block;
- applying the first clock signal to the first control part of a (4n-2)th block, the fourth clock signal to the second control part of the (4n-2)th block, the third clock signal to the third control part of the (4n-2)th block, and the second clock signal to the buffer of the (4n-2)th block;
- applying the second clock signal to the first control part of a (4n-1)th block, the first clock signal to the second control part of the (4n-1)th block, the fourth clock signal to the third control part of the (4n-1)th block, and the third clock signal to the buffer of the (4n-1)th block;
- and applying the third clock signal to the first control part of a (4n)th block, the second clock signal to the second control part of the (4n)th block, the first clock signal to the third control part of the (4n)th block, and the fourth clock signal CLK4 to the buffer of the (4n)th block,
- wherein, in a forward driving, the first clock signal, the second clock signal, the third clock signal, and the fourth clock signal are sequentially input and repeated, and the fourth clock signal is input when the start pulse is input.

17. A method for driving a bi-directional driving circuit of a flat panel display device having (4n) blocks (wherein 'n' is a natural number) driven by a start pulse, first to fourth clock signals of different phases, and first and second power source voltages, each block comprising a shift register having a first control part applying the start pulse or an output signal of a previous block to a first node according to one of the first to fourth clock signals or a signal at the second node, a second control part controlling the second node according to the start pulse, the output signal of the previous block or an output signal of the next block, and one of the first to fourth clock signals, a third control part applying either the start pulse or the output signal of the next block to the first node according to one of the first to fourth clock signals or a signal at the a second node, and a buffer outputting one of the first to fourth clock signals as a shift pulse according to the first and second nodes; and a level shifter shifting a level of the shift pulse output from the shift register in each block, and outputting the shifted level, the method for driving the bi-directional driving circuit, comprising:
- applying the fourth clock signal to the first control part of a (4n-3)th block, the third clock signal to the second control part of the (4n-3)th block, the second clock signal to the third control part of the (4n-3)th block, and the first clock signal to the buffer of the (4n-3)th block;
- applying the first clock signal to the first control part of a (4n-2)th block, the fourth clock signal to the second control part of the (4n-2)th block, the third clock signal to the third control part of the (4n-2)th block, and the second clock signal to the buffer of the (4n-2)th block;
- applying the second clock signal to the first control part of a (4n-1)th block, the first clock signal to the second control part of the (4n-1)th block, the fourth clock signal to the third control part of the (4n-1)th block, and the third clock signal to the buffer of the (4n-1)th block; and
- applying the third clock signal to the first control part of a (4n)th block, the second clock signal to the second control part of the (4n)th block, the first clock signal to the third control part of the (4n)th block, and the fourth clock signal to the buffer of the (4n)th block,
- wherein, in a backward driving, the first clock signal is applied to the third control part thereof, and the fourth clock signal is applied to the buffer thereof, the fourth clock signal, the third clock signal, the second clock signal, and the first clock signal are sequentially input and repeated, and the first clock signal is input when the start pulse is input.

* * * * *